United States Patent [19]
Kim et al.

[11] Patent Number: 6,041,009
[45] Date of Patent: Mar. 21, 2000

[54] APPARATUS FOR STABILIZING AN ANTIFUSE USED FOR A MEMORY DEVICE

[75] Inventors: Jung Pill Kim; In Chul Jung, both of Ichon, Rep. of Korea

[73] Assignee: Hyundai Electronics Industries Co., Ltd., Kyoungki-do, Rep. of Korea

[21] Appl. No.: 09/206,318

[22] Filed: Dec. 7, 1998

[30] Foreign Application Priority Data

Dec. 29, 1997 [KR] Rep. of Korea ............ 97-77394

[51] Int. Cl.[7] .......................................... G11C 7/00
[52] U.S. Cl. ............................... 365/225.7; 365/96
[58] Field of Search ......................... 365/96, 225.7

[56] References Cited

U.S. PATENT DOCUMENTS

| | | | |
|---|---|---|---|
| 5,334,880 | 8/1994 | Abadeer et al. | 307/219 |
| 5,412,593 | 5/1995 | Magel | 365/96 |
| 5,426,614 | 6/1995 | Harward | 365/225.7 |
| 5,689,455 | 11/1997 | Mullarkey et al. | 365/96 |
| 5,706,238 | 1/1998 | Cutter et al. | 365/225.7 |

*Primary Examiner*—A. Zarabian
*Attorney, Agent, or Firm*—Nath & Associates; Gary M. Nath; Gregory B. Kang

[57] ABSTRACT

An antifuse stabilizing apparatus for a memory device stabilizes a programming process of an antifuse. A serial antifuse block has a plurality of antifuses being interconnected in series, and is programmed by applying a voltage being higher than an appropriate applying voltage of each antifuse. An antifuse programming block applies a program voltage being higher than the appropriate applying voltage to both ends of each antifuse in order to program the antifuses. A high voltage portion and a low voltage portion check a coupling state of the antifuses of the serial antifuse block. The applying voltage higher than the appropriate applying voltage is a voltage to be applied to both ends of each antifuse by the antifuse programming block. As a result, all circuits of using an antifuse whose appropriate applying voltage is lower than a power-supply voltage of the peripheral circuit can use the antifuse stably without using an additional circuit.

6 Claims, 3 Drawing Sheets

APPARATUS FOR STABILIZING AN ANTIFUSE USED FOR A MEMORY DEVICE

BACKGROUND OF THE INVENTION

1. Field of the Invention

The present invention relates to an antifuse for a memory device. More particularly, it relates to an apparatus for stabilizing an antifuse used for a memory device.

2. Description of the Prior Art

In general, an antifuse is the opposite element of a fuse. In a programming process, the antifuse is electrically connected, whereas the fuse is electrically blown.

A basic configuration of the antifuse is similar to a capacitor. If the antifuse is programmed, an insulating material in the middle of the antifuse is broken so that the antifuse is electrically connected.

Using the antifuse has various advantages in a semiconductor fabrication. That is, an area used for a fuse can be reduced, a repair is possible after a package process, and the size of the antifuse can be linearly reduced with another parts in opposition to the fuse.

However, a major problem among many other problems occurring when using the antifuse is the instability of the antifuse.

The antifuse has the following problems:

First problem is that the antifuse is not programmed although the program process has already performed (i.e, an electrical connection is not achieved).

Second problem is that a program is deleted in the reading process after the antifuse is programmed (i.e., an electrical connection is cut again).

A third problem is that in an antifuse not programmed is programmed in the reading process (i.e., unexpected programming occurs by a low voltage).

In order to obviate the above problems, the prior art uses the following solutions:

As the first solution, in order to solve the first problem, a high voltage should be employed to stabilize the program the antifuse, and an antifuse whose insulation is easily broken should be also employed.

However, making the high voltage is a burden on a circuit and exerts a bad influence on peripheral circuits. Also, the antifuse which often has an insulation breakdown creates the aforementioned third problem.

As another solution, a voltage when programming is separated from a voltage when reading, so that a read voltage becomes lowered to prevent an unexpected programming, thereby achieving a stabilization of the antifuse.

Hereinafter, technical terms to be used in this specification are defined as follows:

'An appropriate applying voltage' of the antifuse is a voltage between both ends of one antifuse, and means a read voltage which does not induce unexpected programming or unexpected deletion (for example, a programmed antifuse returns to cut state).

Let us suppose that a high voltage which has to programm the antifuse when a program has been intended is "a program voltage" of the antifuse.

The "appropriate applying voltage" and the "program voltage" are changed in response to a structure and shape of the antifuse.

If the "appropriate applying voltage" of the antifuse becomes a power-supply voltage of the peripheral circuits, "the program voltage" requires a very high voltage. In most of cases, the "program voltage" is three times or seven times larger than the "appropriate applying voltage".

On the contrary, if the "program voltage" of the antifuse becomes a power-supply voltage (Vcc or Vpp) of the peripheral circuits, a lower voltage than the power-supply voltage Vcc of the peripheral circuits is required as the "appropriate applying voltage". Assuming that the antifuse is programmable by a power-supply voltage Vcc, the "appropriate applying voltage" should be below ½ Vcc.

In this manner, if a voltage different from the power-supply voltage of the peripheral circuit is employed, a level shifting is required for transmitting a signal to the peripheral circuit, thereby requiring a supplementary circuit.

SUMMARY OF THE INVENTION

Accordingly, the present invention is directed to an apparatus for stabilizing an antifuse used for a memory device that substantially obviates one or more of the problems due to the limitations and disadvantages of the related art.

It is an object of the present invention to provide an apparatus for stabilizing an antifuse which reduces a voltage to be loaded on each antifuse by connecting the antifuses in series, and thus, uses the antifuses by using a power-supply voltage being used in a peripheral circuit without using an additional low voltage.

To achieve the above object, an apparatus for stabilizing the antifuse according to the present invention includes: a serial antifuse block which has a plurality of antifuses being interconnected in series, and is programmed by an applying voltage being higher than an appropriate applying voltage of each antifuse; an antifuse programming block which applies a program voltage being higher than the appropriate applying voltage to both ends of each antifuse in order to program the antifuses; a high voltage portion for checking a coupling state of the antifuses of the serial antifuse block; and a low voltage portion for checking a coupling state of the antifuses of the serial antifuse block.

An applying voltage which is higher than the appropriate applying voltage means a voltage is to be applied to both ends of each antifuse by the antifuse programming block.

The low voltage portion means a ground voltage, but it can use a bulk voltage applied to a bulk of a cell transistor of a memory device.

Additional features and advantages of the invention will be set forth in the description which follows, and in part will be apparent from the description, or may be learned by practice of the invention. The objective and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Further objects and other advantages of the present invention will become apparent from the following description in conjunction with the attached drawings, in which.

DETAILED DESCRIPTION OF THE PREFERRED EMBODIMENTS

A preferred embodiment of the present invention will now be described in detail with reference to the accompanying drawings.

Figure 2:
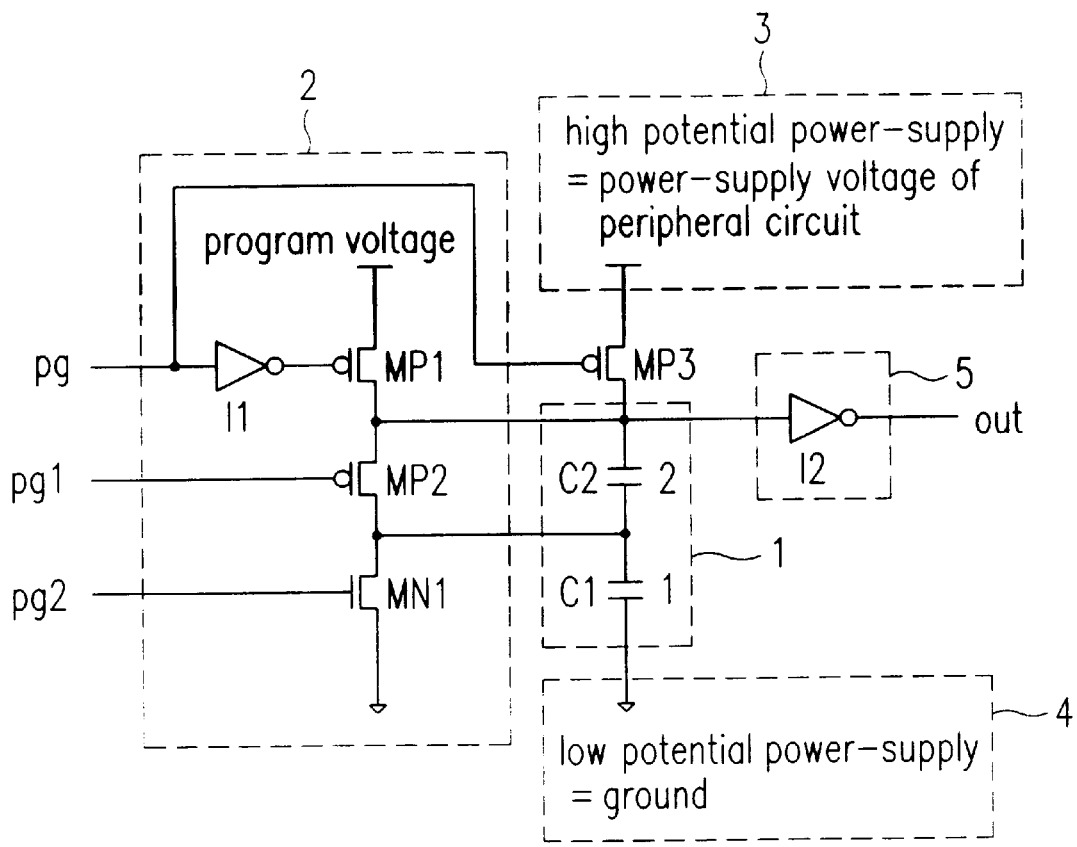
FIG. 2 is a circuit diagram in accordance with a preferred embodiment of the present invention.

FIG. 2 is a circuit diagram in accordance with a preferred embodiment of the present invention.

As shown in FIG. 2, a power-supply voltage of a peripheral circuit is used as a high potential power-supply 3, a ground voltage is used as a low potential power-supply 4, and a higher voltage (e.g., Vpp) than the power-supply voltage of the peripheral circuit is used as a program voltage.

As another preferred embodiment, the power-supply voltage Vcc of the peripheral circuit may be used as the program voltage, and the program voltage may be used as a word line activation voltage of a memory element.

Since two antifuses are interconnected in series in the preferred embodiment of FIG. 2, the half (i.e., ½ Vcc) of a power-supply voltage of the peripheral circuit is used as the appropriate applying voltage.

FIGS. 3A–3D are a timing diagram of the circuit shown in FIG. 2.

Referring to FIGS. 3A–3D, a section a means a status wherein an antifuse is not programmed, a section b means a status wherein a first antifuse C1 of a first block 1 of FIG. 2 is blown, a section c means a status wherein a second antifuse C2 of FIG. 2 is blown, and a section d means a status wherein the antifuse is programmed.

Namely, this preferred embodiment of FIG. 3 can be used as a non-volatile option display device for displaying two states with a power-supply voltage of the peripheral circuit through a programming process.

The operations of the present invention will now be described with reference to FIGS. 1–3D.

Figure 1:
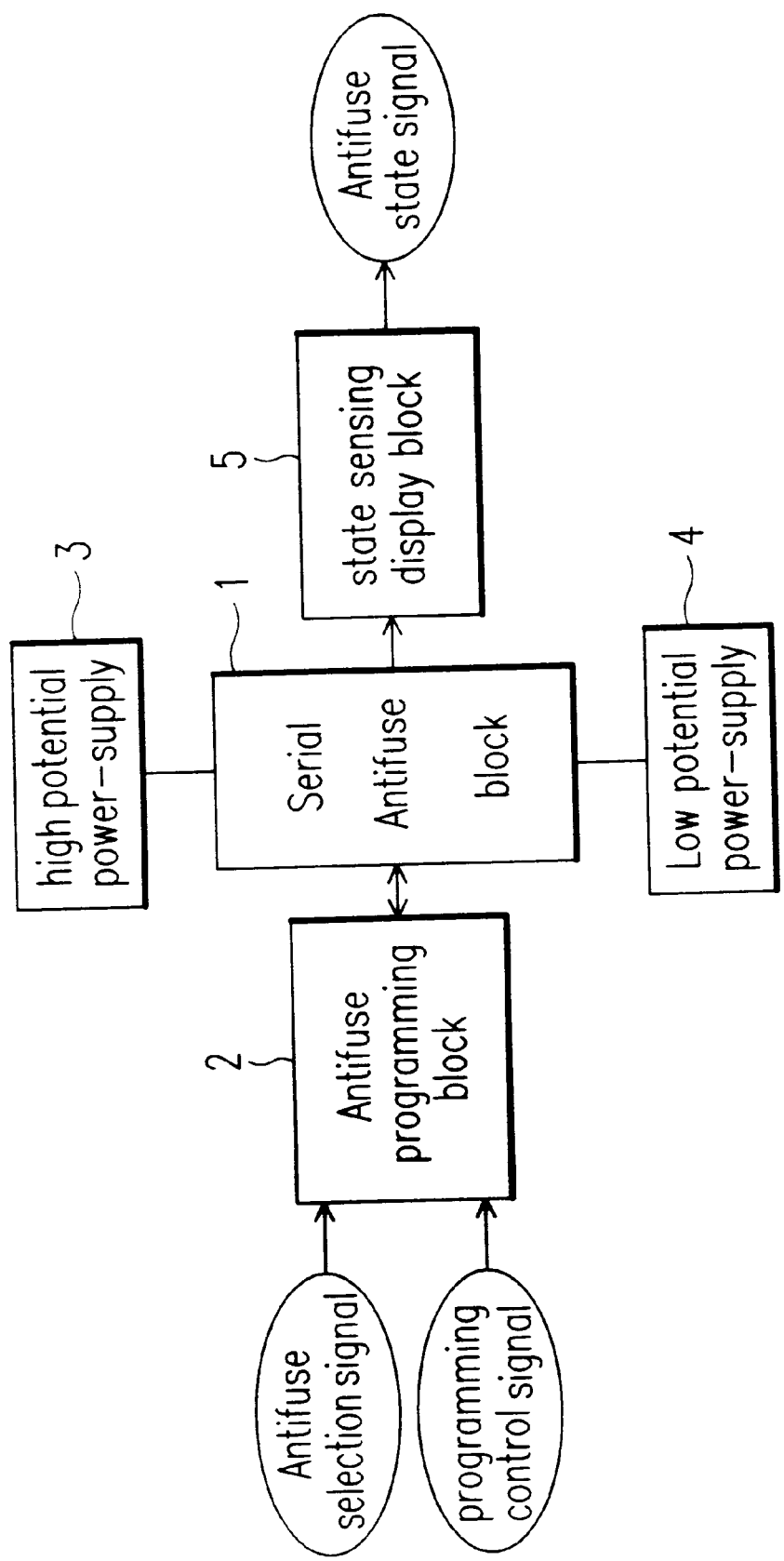
FIG. 1 is a block diagram of an antifuse stabilizing apparatus in accordance with the present invention.
Figures 3A, 3B, 3C, 3D:
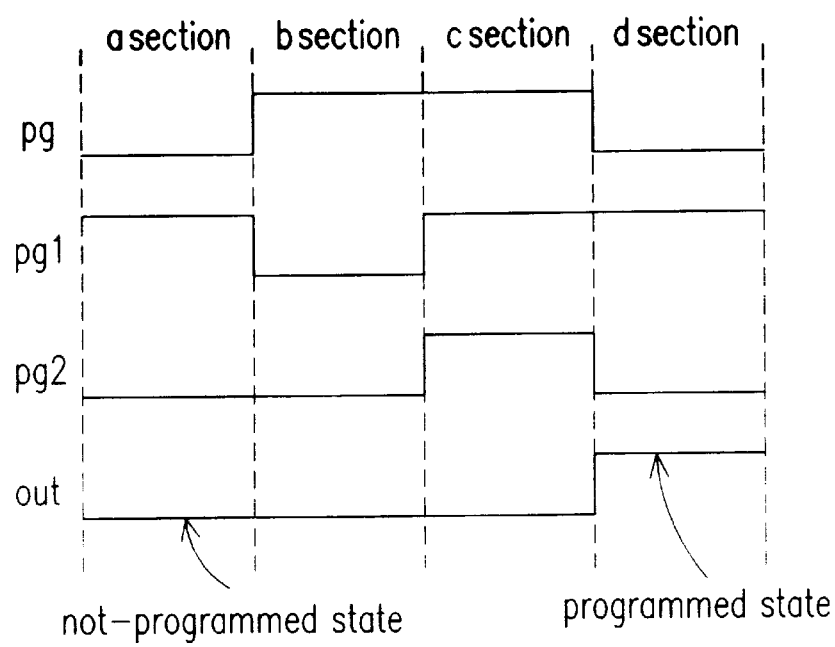
FIGS. 3A–3D are a timing diagram of the circuit shown in FIG. 2.

In the section a, as shown in FIG. 3A, a programming control signal pg of low level is inputted to the antifuse programming block 2 of FIG. 1.

The low level programming control signal pg is inverted to a high level programming control signal pg by an inverter I1. The high level programming control signal pg is inputted to a gate terminal of a p-channel metal oxide semiconductor (hereinafter referred to as PMOS) transistor MP1, thereby turning off the PMOS transistor MP1.

Under this condition, as shown in FIG. 3B, a first antifuse selection signal pg1 of high level is inputted to a gate terminal of a PMOS transistor MP2, thereby turning off the PMOS transistor MP2.

As shown in FIG. 3C, a second antifuse selection signal pg2 of low level is inputted to a gate terminal of a n-channel MOS (hereinafter referred to as NMOS) transistor MN1, thereby turning off the NMOS transistor MN1.

In the meantime, the low level programming control signal pg being inputted to the antifuse programming block 2 is inputted to a gate terminal of a PMOS transistor MP3, thereby turning on the PMOS transistor MP3.

Therefore, a program voltage is not applied to the serial antifuse block 1 because of the turn-off operations of the PMOS transistors MP1 and MP2 and the NMOS transistor MN1; thus an output signal OUT of a state sensing display block 5 becomes a low level as shown in FIG. 3D.

Under this condition, in the section b wherein the first antifuse C1 is blown, as shown in FIG. 3A, a programming control signal pg of high level is inputted to the antifuse programming block 2.

The high level programming control signal pg is inverted to a low level programming control signal pg by the inverter I1. The low level programming control signal pg is inputted to a gate terminal of PMOS transistor MP1, thereby turning off the PMOS transistor MP1.

Under this condition, as shown in FIG. 3B, the first antifuse selection signal pg1 of low level is inputted to a gate terminal of PMOS transistor MP2, thereby turning off the PMOS transistor MP2.

As shown in FIG. 3C, the second antifuse selection signal pg2 of low level is inputted to a gate terminal of NMOS transistor MN1, thereby turning off the NMOS transistor MN1.

In the meantime, the high level programming control signal pg input to the antifuse programming block 2 is inputted to a gate terminal of PMOS transistor MP3, thereby turning on the PMOS transistor MP3.

Therefore, a program voltage is applied to the first antifuse C1 of the serial antifuse block 1 by the turn-on operations of the PMOS transistors MP1 and MP2 and shorts the first antifuse C1, so that an output signal OUT of the state sensing display block 5 becomes a low level as shown in FIG. 3D.

Under the above condition wherein the first antifuse C1 is connected (or programmed), in the section c meaning that the second antifuse C2 is programmed (or connected), as shown in FIG. 3A, a programming control signal pg of high level is inputted to the antifuse programming block 2.

The high level programming control signal pg is inverted to a low level programming control signal pg by the inverter I1. The low level programming control signal pg is inputted to a gate terminal of PMOS transistor MP1, thereby turning on the PMOS transistor MP1.

Under this condition, as shown in FIG. 3B, the first antifuse selection signal pg1 of high level is inputted to a gate terminal of PMOS transistor MP2, thereby turning off the PMOS transistor MP2.

As shown in FIG. 3C, the second antifuse selection signal pg2 of high level is inputted to a gate terminal of NMOS transistor MN1, thereby turning on the NMOS transistor MN1.

In the meantime, the high level programming control signal pg being inputted to the antifuse programming block 2 is inputted to a gate terminal of PMOS transistor MP3, thereby turning off the PMOS transistor MP3.

Therefore, a program voltage is applied to the second antifuse C2 of the serial antifuse block 1 by the turn-on operations of the PMOS transistor MP1 and the NMOS transistor MN1 and shorts the second antifuse C2, so that an output signal OUT of the state sensing display block 5 becomes a low level as shown in FIG. 3D.

In the section d which indicates that a programming have been performed, wherein the first and second antifuses C1 and C2 are shorted, as shown in FIG. 3A, a programming control signal pg of low level is inputted to the antifuse programming block 2.

The low level programming control signal pg is inverted to a high level programming control signal pg by the inverter I1. The high level programming control signal pg is inputted to a gate terminal of PMOS transistor MP1, thereby turning off the PMOS transistor MP1.

Under this condition, as shown in FIG. 3B, the first antifuse selection signal pg1 of high level is inputted to a gate terminal of PMOS transistor MP2, thereby turning off the PMOS transistor MP2.

As shown in FIG. 3C, the second antifuse selection signal pg2 of low level is inputted to a gate terminal of NMOS transistor MN1, thereby turning off the NMOS transistor MN1.

In the meantime, the low level programming control signal pg being input to the antifuse programming block 2 is inputted to a gate terminal of PMOS transistor MP3, thereby turning on the PMOS transistor MP3.

Therefore, by the turn-on operation of the PMOS transistor MP3, the high potential power-supply 3 is applied to the low potential power-supply 4 via the second antifuse C2 and the first antifuse C1 of the shorted serial antifuse block 1. At this time, since the PMOS transistor MP3 has a large resistance with a long channel, a potential of an input signal A of the state sensing display block 5 becomes a low level. As a result, an output signal OUT of the state sensing display block 5 becomes a high level as shown in FIG. 3D.

As described above, the antifuse stabilizing apparatus reduces a voltage to be loaded on each antifuse by connecting the antifuses in series, and thus uses the antifuses by using a power-supply voltage being used in a peripheral circuit without using an additional low voltage.

Accordingly, all circuits, using an antifuse whose appropriate applying voltage is lower than a power-supply voltage of the peripheral circuit, can use without using an additional circuit and unstabilizing the antifuse.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. An antifuse stabilizing apparatus for a memory device including a peripheral circuit, the antifuse stabilizing apparatus, comprising:
   a first terminal;
   a second terminal;
   a serial antifuse block which has a plurality of antifuses being interconnected in series between the first terminal and the second terminal;
   an antifuse programming block for applying a program voltage to an electrode of a selected antifuse of said plurality of antifuses of the serial antifuse block in accordance with a plurality of antifuse selection signals;
   a switching means controlled by a programming control signal and for applying selectively a high level voltage to the first terminal; and
   a detecting means for outputting an antifuse state signal detecting whether or not the selected antifuse is programmed,
   wherein a low level voltage is applied to the second terminal; and
   wherein the antifuse programming block is controlled by an inverted signal of the programming control signal.

2. The antifuse stabilizing apparatus as set forth in claim 1, wherein the high level voltage is identical with a power-supply voltage applied to the peripheral circuit.

3. The antifuse stabilizing apparatus as set forth in claim 1, wherein the low level voltage is identical with a bulk voltage applied to a bulk of a cell transistor of the memory device.

4. The antifuse stabilizing apparatus as set forth in claim 1, wherein the low level voltage is identical with a ground voltage applied to the peripheral circuit.

5. The antifuse stabilizing apparatus as set forth in claim 1, wherein the program voltage is a power-supply voltage.

6. The antifuse stabilizing apparatus as set forth in claim 1, wherein the program voltage is a word line activation voltage of the memory device.

* * * * *